US012044708B2

(12) United States Patent
Zhao

(10) Patent No.: US 12,044,708 B2
(45) Date of Patent: Jul. 23, 2024

(54) DIFFERENTIAL SIGNAL CURRENT SENSOR

(71) Applicant: SUZHOU LITTELFUSE OVS CO., LTD., Suzhou (CN)

(72) Inventor: Jianfei Zhao, Suzhou (CN)

(73) Assignee: SUZHOU LITTELFUSE OVS CO., LTD., Suzhou (CN)

(*) Notice: Subject to any disclaimer, the term of this patent is extended or adjusted under 35 U.S.C. 154(b) by 312 days.

(21) Appl. No.: 17/762,231

(22) PCT Filed: Sep. 20, 2019

(86) PCT No.: PCT/CN2019/107032
§ 371 (c)(1),
(2) Date: Mar. 21, 2022

(87) PCT Pub. No.: WO2021/051400
PCT Pub. Date: Mar. 25, 2021

(65) Prior Publication Data
US 2022/0381805 A1 Dec. 1, 2022

(51) Int. Cl.
G01R 15/20 (2006.01)
G01R 19/10 (2006.01)

(52) U.S. Cl.
CPC .......... *G01R 15/202* (2013.01); *G01R 19/10* (2013.01)

(58) Field of Classification Search
CPC ... G01R 1/203; G01R 15/146; G01R 19/0007
See application file for complete search history.

(56) References Cited

U.S. PATENT DOCUMENTS

| 10,481,181 B2* | 11/2019 | Bussing | G01R 15/207 |
| 2006/0232262 A1 | 10/2006 | Tanizawa et al. | |
| 2016/0223594 A1* | 8/2016 | Suzuki | G01R 15/20 |
| 2018/0180649 A1 | 6/2018 | Paci et al. | |

FOREIGN PATENT DOCUMENTS

| CN | 104603623 A | 5/2015 |
| CN | 105044427 A | 11/2015 |
| CN | 207457326 | 6/2018 |
| CN | 109716146 A | 5/2019 |
| CN | 110007123 A | 7/2019 |
| DE | 19946935 B4 | 2/2004 |
| JP | 2003510612 A | 3/2003 |
| JP | 2013044705 A | 3/2013 |
| JP | 2018141634 A | 9/2018 |

OTHER PUBLICATIONS

International Search Report and Written Opinion for PCT/CN2018/107032 mailed Jun. 23, 2020, four (4) pages.
Supplementary European Search Report mailed Sep. 6, 2022 for corresponding European Patent Application No. 19945663.3.

* cited by examiner

*Primary Examiner* — Tung X Nguyen
(74) *Attorney, Agent, or Firm* — KDW FIRM PLLC

(57) ABSTRACT

A differential signal current sensor device (100) may include a conductor (102) for conducting electrical current in a current direction. The conductor (102) may include a first slot (120A) extending from a first perimeter edge (122), towards a central axis extending along a length of the conductor (102), and a second slot (120B) extending from a second perimeter edge (124), towards the central axis. The current sensor device (100) may further include a first current sensor (130) positioned within the first slot (120A) and a second current sensor (132) positioned within the second slot (120B).

20 Claims, 4 Drawing Sheets

DIFFERENTIAL SIGNAL CURRENT SENSOR

FIELD OF THE DISCLOSURE

The present disclosure is generally related to the field of integrated current sensor structures. More particularly, embodiments of the present disclosure relate a differential signal current sensor.

BACKGROUND OF THE DISCLOSURE

A current sensor is a device that detects electric current (AC or DC) in a wire and generates a signal proportional to that current. The generated signal can be an analog voltage or a current or even a digital output. One method for detecting and measuring an electrical current in an electrically conductive wire uses a Hall sensor based on the Hall effect. The Hall effect is the production of a voltage difference (the Hall voltage) across an electrically conductive material (such as a wire), transverse to an electric current in the material and to an applied magnetic field perpendicular to the current. The voltage difference can be measured and, if the applied magnetic field is known, the current in the electrically conductive material can be deduced. Such a current sensor can be called a magnetic current sensor.

It is often desirable to exclude or mitigate stray magnetic fields from the magnetic current sensor. Since the current deduced is dependent on the local magnetic field applied to the magnetic sensor, any unknown or undesirable magnetic field can cause incorrect measurements. It is also desirable to provide a consistent and accurate current measurement at the moment of measurement for both direct and alternating electrical currents for a wide range of frequencies.

There is a need, therefore, for current-sensor structures that provide consistent and accurate current measurements in environments with stray magnetic fields and for electrical currents having a wide frequency range.

SUMMARY OF THE DISCLOSURE

In one approach, a current sensor device may a conductor for conducting electrical current in a current direction, the conductor including a first slot extending from a first perimeter edge, towards a central axis extending along a length of the conductor; and a second slot extending from a second perimeter edge, towards the central axis. The current sensor device may further include a first current sensor positioned within the first slot and a second current sensor positioned within the second slot.

In another approach, a differential signal current sensor device may include a conductor for conducting electrical current in a current direction, the conductor including a first slot extending from a first perimeter edge, towards a central axis extending along a length of the conductor, and a second slot extending from a second perimeter edge, towards the central axis. The first and second slots may be offset from one another along the length of the conductor. The differential signal current sensor device may further include a first current sensor positioned within the first slot and a second current sensor positioned within the second slot.

In yet another approach, a differential signal current sensor device may include a conductor for conducting electrical current in a current direction, the conductor including a first slot extending from a first perimeter edge, towards a central axis extending along a length of the conductor, and a second slot extending from a second perimeter edge, towards the central axis. The first and second slots may be offset from one another along the length of the conductor. The differential signal current sensor device may further include a first current sensor positioned within the first slot and a second current sensor positioned within the second slot, wherein the first and second current sensors measure a vertical magnetic flux generated by the electrical current through the conductor, wherein the vertical magnetic flux at the first slot is oriented in a first direction, and wherein the vertical magnetic flux at the second slot is oriented in a second direction, opposite the first direction.

BRIEF DESCRIPTION OF THE DRAWINGS

The accompanying drawings illustrate exemplary approaches of the disclosed embodiments so far devised for the practical application of the principles thereof, and wherein.

Figure 1:
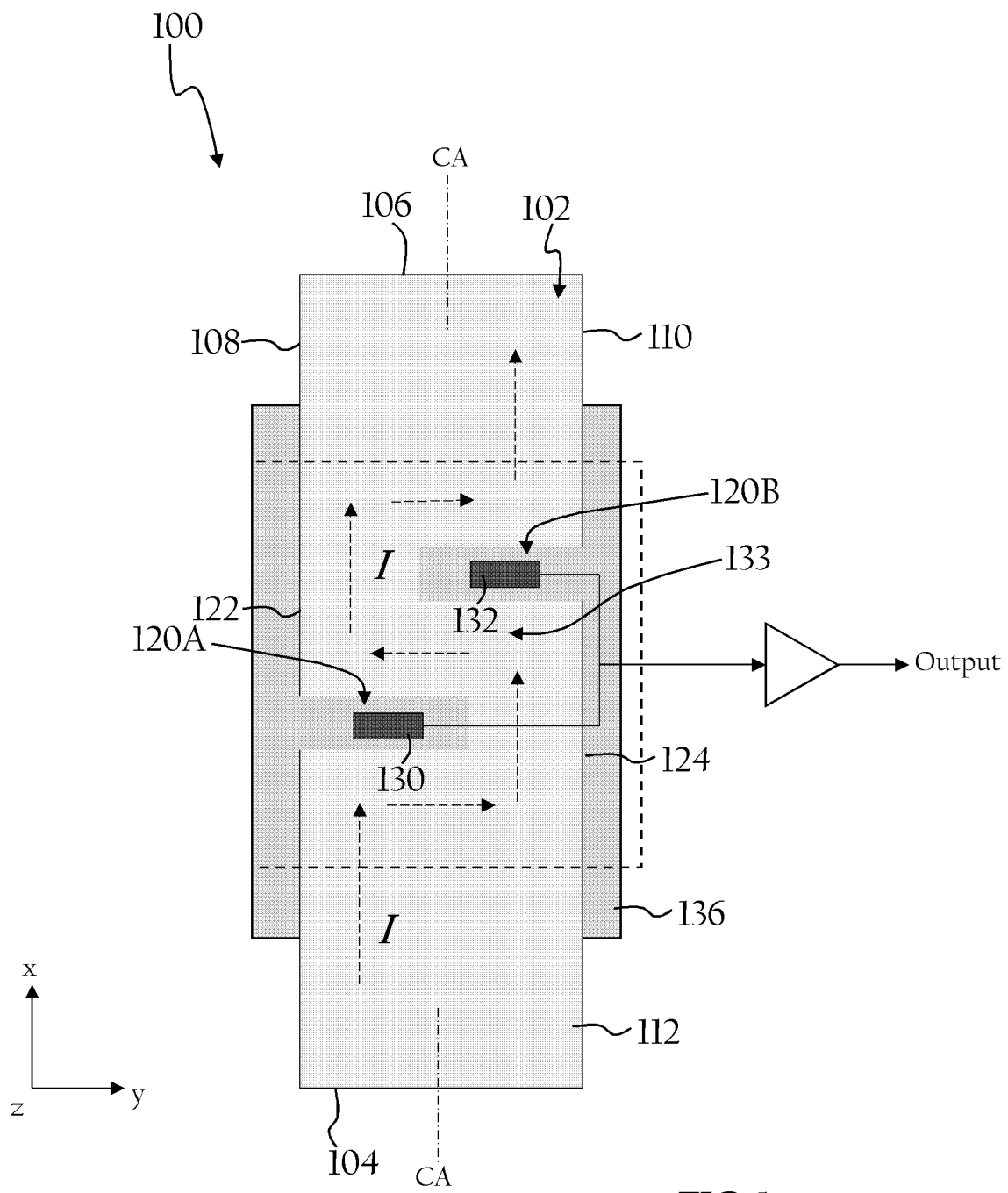
FIG. 1 depicts a top view of a current sensor device according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Current sensor devices in accordance with the present disclosure will now be described more fully hereinafter with reference to the accompanying drawings, where embodiments of the methods are shown. The devices may be embodied in many different forms and are not to be construed as being limited to the embodiments set forth herein. Instead, these embodiments are provided so the disclosure will be thorough and complete, and will fully convey the scope of the system and method to those skilled in the art.

Figure 2:
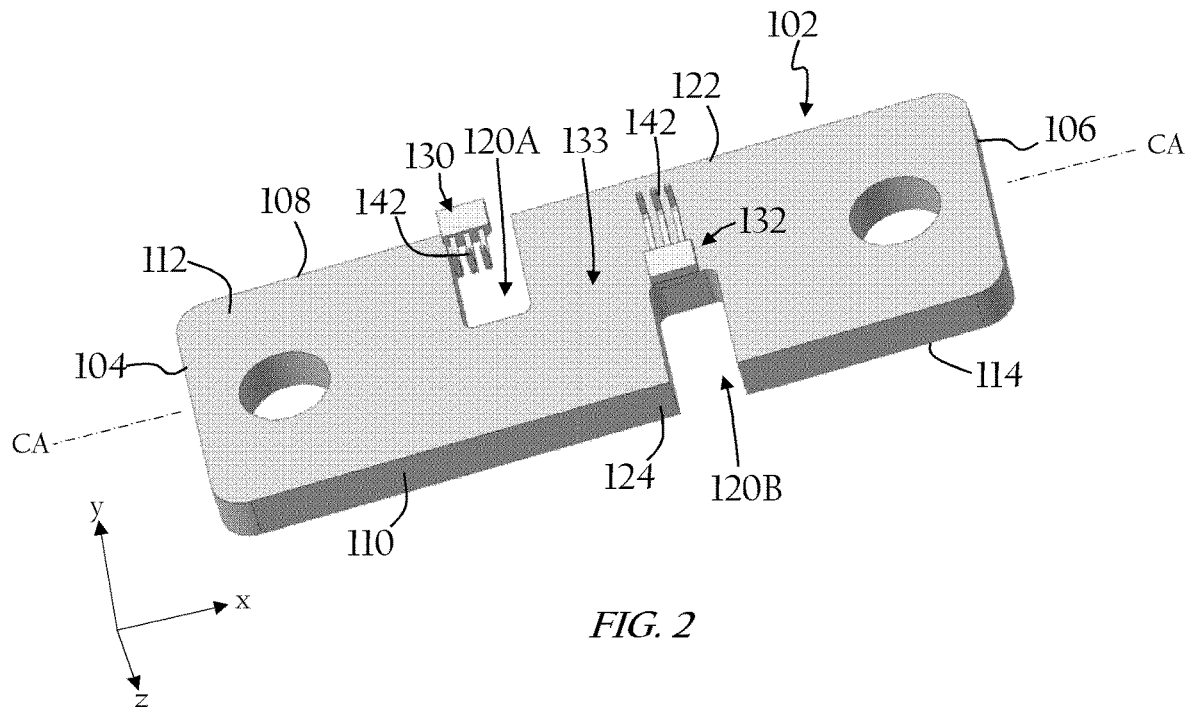
FIG. 2 is a perspective view of a conductor of the current sensor device of FIG. 1 according to embodiments of the present disclosure.

Turning to FIGS. 1-2, a differential signal current sensor device (hereinafter "device") 100 according to embodiments of the present disclosure will be described. As shown, the device 100 may include a conductor 102 for conducting electrical current (I) in a current direction, as demonstrated by a series of broken-line arrows traversing the conductor 102. As shown, the conductor 102, which may be a busbar, includes a first end 104 opposite a second end 106, a first side 108 opposite a second side 110, and a first main side 112 opposite a second main side 114. A length of the conductor 102 extending between the first and second ends 104, 106 (e.g., along the x-direction) may be greater than a width of the conductor 102 extending between the first and second sides 108, 110 (e.g., along the y-direction). Furthermore, the length and the width of the conductor 102 may be greater than a thickness thereof, wherein the thickness extends between the first and second main sides 112, 114 (e.g., along the z-direction). Although non-limiting, the conductor 102 may have a plurality of conductor surfaces and can be a laminated structure with different electrically isolated layers of materials, for example electrically conductive materials.

As further shown, the conductor 102 may include one or more notches or slots. In some embodiments, the conductor 102 has a first slot 120A extending from a first perimeter edge 122 and towards a central axis (CA) extending along the length of the conductor 102. The conductor 102 further includes a second slot 120B extending from a second perimeter edge 124, towards the central axis. As shown, the first and second perimeter edges 122 and 124 correspond to the first side 108 and the second side of the conductor 102, respectively. The first and second slots 120A-120B may extend through the thickness of the conductor 102, e.g., between the first main side 112 and the second main side 114. Although non-limiting, the first and second slots 120A-120B may have a substantially rectangular shape or profile.

As shown, the first and second slots 120A-120B may be offset along the central axis with respect to one another. Said differently, the first and second slots 120A-120B may extend parallel to one another, separated by a central section 133 of the conductor 102. The central section 133 may ensure that the conductor 102 does not overheat in the areas of the first and/or second slots 120A-120B when the current I is applied.

As further shown, the device 100 may include a first current sensor 130 positioned within the first slot 120A and a second current sensor 132 positioned within the second slot 120B. The first and second current sensors 130, 132 are generally not in direct contact with a surface of the conductor 102. In some embodiments, the first and second current sensors 130, 132 may be integrated circuits that can be molded in a package and disposed on a printed circuit board 136 or other wiring substrate. The integrated circuit can be electrically connected to any one or any combination of wires, a lead frame, solder bumps and other electrical conductors on the printed circuit board 136 using leads or pins 142 (FIG. 2) on the integrated circuit package. As shown, the conductor 102 may be positioned over and/or coupled to the printed circuit board 136. In other embodiments, the conductor 102 is free-standing and does not require a separate support, such the printed circuit board 136.

The printed circuit board 136 can include only integrated circuits that sense currents or can include other integrated circuits that provide control or signal processing capabilities. In some embodiments, a vertical Hall sensor is used. In other embodiments a two-axis or three-axis magnetic field sensor is used (employing the Hall effect, AMR, GMR, or any other suitable sensing technology). Alternative magnetic sensor technologies such as giant magnetoresistive sensors (GMR), tunnelling magnetoresistive sensors (TMR), anisotropic magnetoresistive sensors (AMR), flux gates or Rogowski coils, for example that sense in-plane magnetic fields, can also be used instead of a Hall sensor.

In some embodiments, the first and second current sensors 130, 132 can be integrated into a single chip, a single integrated circuit or a single package. Each of the first and second current sensors 130, 132 may be offset a distance from the central axis. For example, the first current sensor 130 is disposed between the first perimeter edge 122 and the central axis, and the second current sensor 132 is disposed between the second perimeter edge 124 and the central axis. Furthermore, as discussed above, the first and second current sensors 130, 132 may be offset from one another along the central axis by the central section 133 of the conductor 102. As a result, the first and second current sensors 130, 132 are disposed in relation to the conductor 102 to measure a vertical magnetic flux.

Although offset, the first and second current sensors 130, 132 disposed opposite each other on opposite sides of the conductor 102. In such an arrangement, device 100 can be operated in a differential way such that the signals from the first and second current sensors 130, 132 can be subtracted to cancel out external magnetic fields and thereby improve the signal-to-noise ratio of the device. Such an embodiment can reduce the need for a shield.

Figure 3:
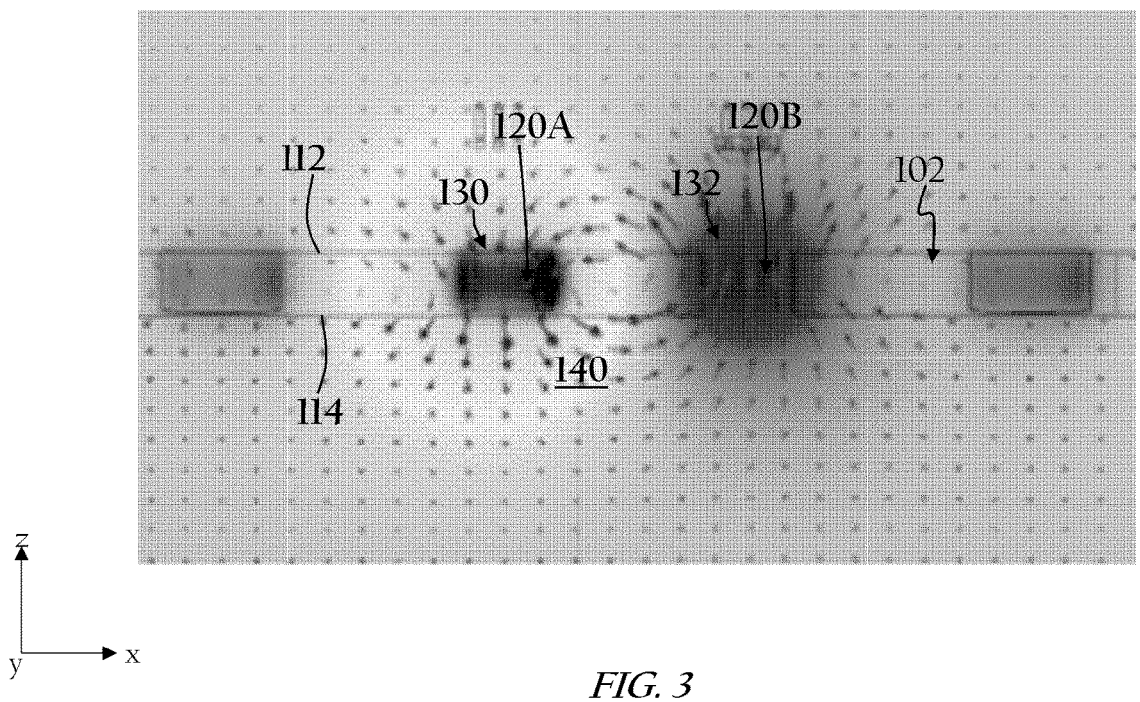
FIG. 3 is a side view of the busbar of FIG. 2 showing magnetic flux lines according to embodiments of the present disclosure.

As shown in FIG. 3, the first and second current sensors 130, 132 measure a vertical magnetic flux 140 generated by the electrical current through the conductor 102, wherein the vertical magnetic flux 140 at the first slot 120A is oriented in a first direction (e.g., top to bottom along the z-direction), and wherein the vertical magnetic flux 140 at the second slot 120B is oriented in a second direction (e.g., bottom to top along the z-direction), opposite the first direction. Said differently, the vertical magnetic flux 140 at the first slot 120A travels from the first main side 112 towards the second main side 114 as it passes through the conductor 102, and the vertical magnetic flux 140 at the second slot 120B travels from the second main side 114 towards the first main side 112 as it passes through the conductor 102. It will be appreciated that these directions may be reversed in an alternative embodiment.

Figure 4:
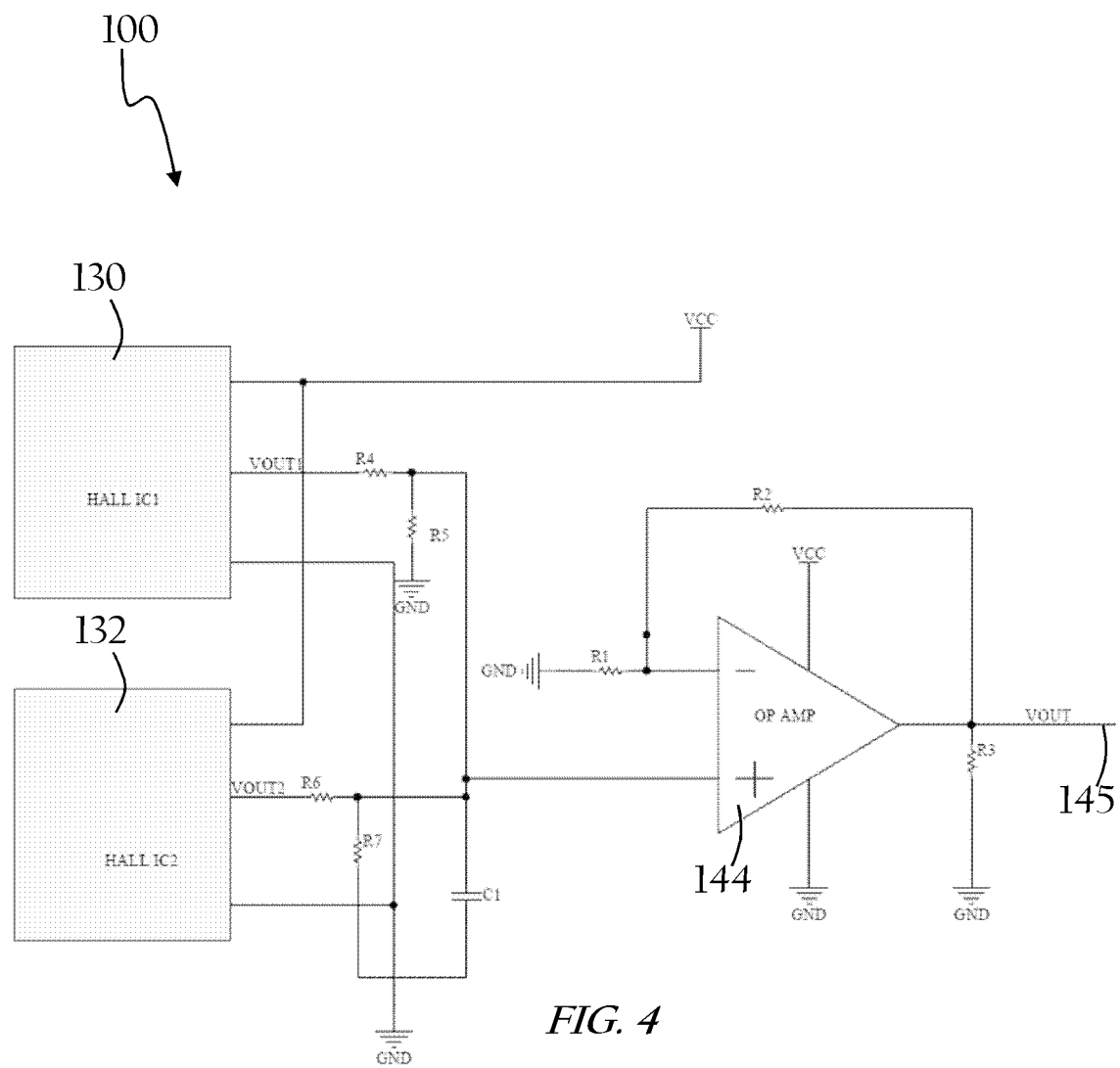
FIG. 4 is a circuit diagram of the current sensor device of FIG. 1 according to embodiments of the present disclosure.

FIG. 4 demonstrates the device 100 as a circuit diagram according to embodiments of the present disclosure. In one non-limiting embodiments, the first current sensor 130 and the second current sensor 132 output respective voltages (VOUT1 and VOUT2), which are received by an op amp 144. As shown, the first and second current sensors 130, 132 may be Hall sensors. The op amp 144 generates an output signal 145 (VOUT), which is the difference between the signals being applied to its two individual inputs (+, −). This differential output signal 145 beneficially resists external stray field.

Figure 5:
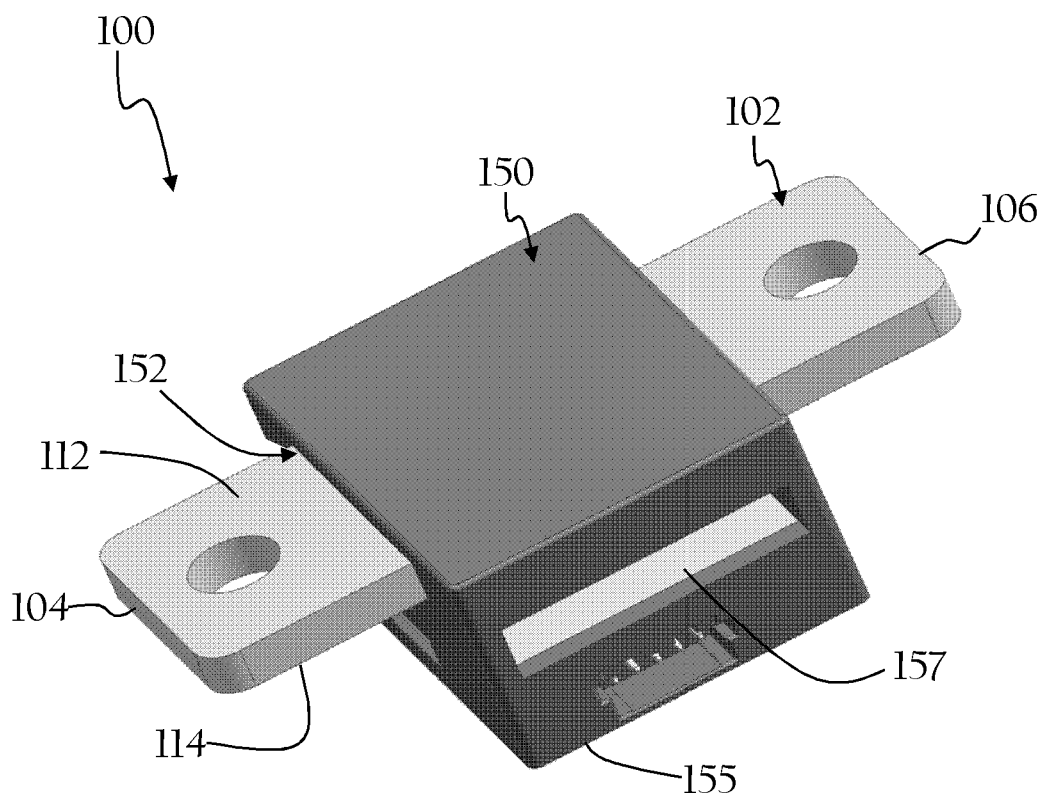
FIG. 5 is a current sensor device including a housing according to embodiments of the present disclosure.

Turning now to FIG. 5, a non-limiting example of the device 100 including a housing 150 partially containing or encasing the conductor 102 is shown. In some embodiments, the housing 150 may include an opening 152 for receiving the conductor 102. For example, the housing 150 may extend along the first main side 112 and the second main side 114 of the conductor 102, with the first end 104 and the second end 106 of the conductor 102 extending outside of the housing 150. In some embodiments, the housing 150, which may be nylon, can be coupled to a printed circuit board (not shown) along a bottom surface 155 thereof. As further shown, the device 100 may further include a thermosetting material 157 to encapsulate the printed circuit board assembly the first and second current sensors 130, 132 (not shown) contained with the housing 150.

In sum, embodiments herein provide a novel device having high accuracy, protection against temperature increases, and anti-external stray field interference. Furthermore, the device of the present disclosure does not require an integrated magnetic concentrator (IMC), for example, as a shielding to resist external stray field. Still furthermore, no additional shielding around the magnetic flux is required in the present device, which reduces parts and therefore cost.

As used herein, an element or step recited in the singular and proceeded with the word "a" or "an" is understood as not excluding plural elements or steps, unless such exclusion is explicitly recited. Furthermore, references to "one embodiment" of the present disclosure are not intended to be interpreted as excluding the existence of additional embodiments also incorporating the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions and are both conjunctive and disjunctive in operation. For example, expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure. The directional references do not create limitations, particularly as to the position, orientation, or use of the disclosure. Connection references (e.g., attached, coupled, connected, and joined) are to be construed broadly and may include intermediate members between a collection of elements and relative movement between elements unless otherwise indicated. As such, connection references do not necessarily infer two elements are directly connected and in fixed relation to each other.

Furthermore, identification references (e.g., primary, secondary, first, second, third, fourth, etc.) are not intended to connote importance or priority, and are used to distinguish one feature from another. The drawings are for purposes of illustration, and the dimensions, positions, order and relative sizes reflected in the drawings attached hereto may vary.

Furthermore, the terms "substantial" or "approximately," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A current sensor device, comprising:
   a conductor for conducting electrical current in a current direction, the conductor comprising:
      a first slot extending from a first perimeter edge, towards a central axis extending along a length of the conductor; and
      a second slot extending from a second perimeter edge, towards the central axis; and
   a first current sensor positioned within the first slot and a second current sensor positioned within the second slot, wherein the first current sensor is positioned between the first perimeter edge and the central axis, and wherein the second current sensor is positioned between the second perimeter edge and the central axis.

2. The current sensor device of claim 1, wherein the first slot and the second slot are offset with respect to one another along the length of the conductor.

3. The current sensor device of claim 1, wherein the conductor is a busbar.

4. The current sensor device of claim 1, wherein the length of the conductor is greater than a width and a thickness of the conductor.

5. The current sensor device of claim 1, wherein the first and second current sensors are integrated circuits.

6. The current sensor device of claim 1, further comprising a printed circuit board, wherein the conductor is positioned over the printed circuit board.

7. The current sensor device of claim 1, wherein the first and second current sensors are disposed in relation to the conductor to measure a vertical magnetic flux, wherein a the vertical magnetic flux at the first slot is oriented in a first direction, and wherein the vertical magnetic flux at the second slot is oriented in a second direction, opposite the first direction.

8. The current sensor device of claim 1, wherein the first and second current sensors are not in direct contact with the conductor.

9. A differential signal current sensor device, comprising:
   a conductor for conducting electrical current in a current direction, the conductor comprising:
      a first slot extending from a first perimeter edge, towards a central axis extending along a length of the conductor; and
      a second slot extending from a second perimeter edge, towards the central axis, wherein the first and second slots are offset from one another along the length of the conductor; and
   a first current sensor positioned within the first slot and a second current sensor positioned within the second slot, wherein the first current sensor is positioned between the first perimeter edge and the central axis, and wherein the second current sensor is positioned between the second perimeter edge and the central axis.

10. The differential signal current sensor device of claim 9, wherein the first slot and the second slot extend perpendicular to one another.

11. The differential signal current sensor device of claim 9, wherein the conductor is a busbar.

12. The differential signal current sensor device of claim 9, wherein the length of the conductor is greater than a width and a thickness.

13. The differential signal current sensor device of claim 9, wherein the first and second current sensors are integrated circuits.

14. The differential signal current sensor device of claim 9, further comprising a printed circuit board, wherein the conductor is positioned over the printed circuit board.

15. The differential signal current sensor device of claim 9, wherein the first and second current sensors are disposed in relation to the conductor to measure a vertical magnetic flux, wherein a the vertical magnetic flux at the first slot is oriented in a first direction, and wherein the vertical magnetic flux at the second slot is oriented in a second direction, opposite the first direction.

16. A differential signal current sensor device, comprising:
   a conductor for conducting an electrical current in a current direction, the conductor comprising:
      a first slot extending from a first perimeter edge, towards a central axis extending along a length of the conductor; and
      a second slot extending from a second perimeter edge, towards the central axis, wherein the first and second slots are offset from one another along the length of the conductor; and
   a first current sensor positioned within the first slot and a second current sensor positioned within the second slot, wherein the first and second current sensors measure a vertical magnetic flux generated by the electrical current through the conductor, wherein the vertical magnetic flux at the first slot is oriented in a first direction, and wherein the vertical magnetic flux at the second slot is oriented in a second direction, opposite the first direction, wherein the first current sensor is positioned between the first perimeter edge and the central axis, and wherein the second current sensor is positioned between the second perimeter edge and the central axis.

17. The differential signal current sensor device of claim 16, wherein the first slot and the second slot extend parallel to one another, wherein the first current sensor is disposed between the first perimeter edge and the central axis, and wherein the second current sensor is disposed between the second perimeter edge and the central axis.

18. The differential signal current sensor device of claim 16, wherein the conductor is a busbar, and wherein the length of the busbar is greater than a width and a thickness of the busbar.

19. The differential signal current sensor device of claim 16, wherein the first and second current sensors are Hall-effect sensors.

20. The differential signal current sensor device of claim 16, further comprising a printed circuit board, wherein the conductor is positioned over the printed circuit board.

* * * * *